United States Patent
Lin

(10) Patent No.: US 6,429,464 B1
(45) Date of Patent: Aug. 6, 2002

(54) LIGHT EMITTING DIODE

(75) Inventor: Ming-Te Lin, Taipei Hsien (TW)

(73) Assignee: Para Light Electronics Co., Ltd., Taipei Hsien (TW)

(*) Notice: Subject to any disclaimer, the term of this patent is extended or adjusted under 35 U.S.C. 154(b) by 0 days.

(21) Appl. No.: 09/784,103

(22) Filed: Feb. 16, 2001

(51) Int. Cl.⁷ ............................................. H01L 33/00
(52) U.S. Cl. ..................... 257/99; 257/98; 257/100; 257/431; 257/434; 257/680
(58) Field of Search ...................... 257/99, 98, 100, 257/431, 432, 433, 434, 680

(56) References Cited

U.S. PATENT DOCUMENTS 5,001,609 A * 3/1991 Gardner et al. ............... 362/32
6,121,637 A * 9/2000 Isokawa et al. ............... 257/99

FOREIGN PATENT DOCUMENTS

JP 58222578 * 12/1983

* cited by examiner

Primary Examiner—Nathan Flynn
Assistant Examiner—Remmon R. Fordé
(74) Attorney, Agent, or Firm—Rosenberg, Klein & Lee

(57) ABSTRACT

A light emitting diode includes a frame having increased thickness to enable a bowl portion thereof to have an increased depth more than 0.6 mm. Radiating blocks are provided below the frame and a layer of radiation-enhancing material is applied over bottoms of the frame and the radiating blocks to increase a radiating area of the light emitting diode. And, leads are downward extended from two outer sides of the frame. The light emitting diode therefore has increased radiation efficiency and light-emitting efficiency.

4 Claims, 3 Drawing Sheets

LIGHT EMITTING DIODE

BACKGROUND OF THE INVENTION

1. Field of the Invention

The present invention relates to a light emitting diode, and more particularly to a light emitting diode having enhanced radiation effect and light-emitting efficiency.

2. Description of Related Prior Art

A conventional vertical-type light emitting diode, as shown in FIG. 1, includes a frame A2 on which a bowl portion is formed for receiving a chip A1 therein. The frame A2 has two extended leads, at lower ends of which the frame A2 is soldered onto a printed circuit board A4 at soldering points A3. This type of conventional light emitting diode has relatively deep bowl portion that facilitates to enhanced light-emitting efficiency. However, it uses only one of the two leads to radiate heat and therefore has inferior radiation efficiency. It is theoretically known that the radiation effect is in proportion to the light-emitting efficiency. The poorer the radiation effect is, the poorer the light-emitting efficiency is. The vertical-type light emitting diode shown in FIG. 1 has poor radiation effect and therefore needs improvement.

FIG. 2 illustrates another conventional light emitting diode that includes a frame B2 for holding a chip B1 thereon. The frame B2 has increased width and leads having increased diameter, compared with the frame A2 shown in FIG. 1. The leads are also soldered onto a printed circuit board B4 at soldering points B3. In this type of conventional light emitting diode, the width-increased frame B2 enables a reduced overall height of the light emitting diode, and both the two leads are used to radiate heat to provide an enhanced radiating capacity. However, the frame B2 is thin in its thickness and the bowl portion on the frame B2 has a relatively small depth of about 0.4 mm that is smaller than the bowl portion on the frame A2 for the vertical-type light emitting diode of FIG. 1. Since the depth of the bowl portion also has connection with the light-emitting efficiency, there is limitation in the light-emitting efficiency of the light emitting diode of FIG. 2 and an improvement on it is desired.

It is therefore tried by the inventor to develop a light emitting diode that has relatively deep bowl portion and increased radiation and light-emitting efficiency.

SUMMARY OF THE INVENTION

A primary object of the present invention is to provide a light emitting diode that has relatively deep bowl portion and increased radiation and light-emitting efficiency. To achieve the above and other objects, the light emitting diode of the present invention includes a frame having an increased thickness to enable the bowl portion formed thereon to have a depth more than 0.6 mm to provide enhanced light-emitting efficiency. The frame also includes leads downward extended from the frame and radiating blocks provided at or close to a bottom of the frame to increase the radiation efficiency. The light emitting diode of the present invention further includes a layer of radiation-enhancing material over bottoms of the frame and the radiating blocks to enhance the radiating capacity of the light emitting diode. In the present invention, the frame and the radiating blocks or the layer of radiation-enhancing material is connected to and in direct contact with the printed circuit board to further increase the radiating area of the light emitting diode.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
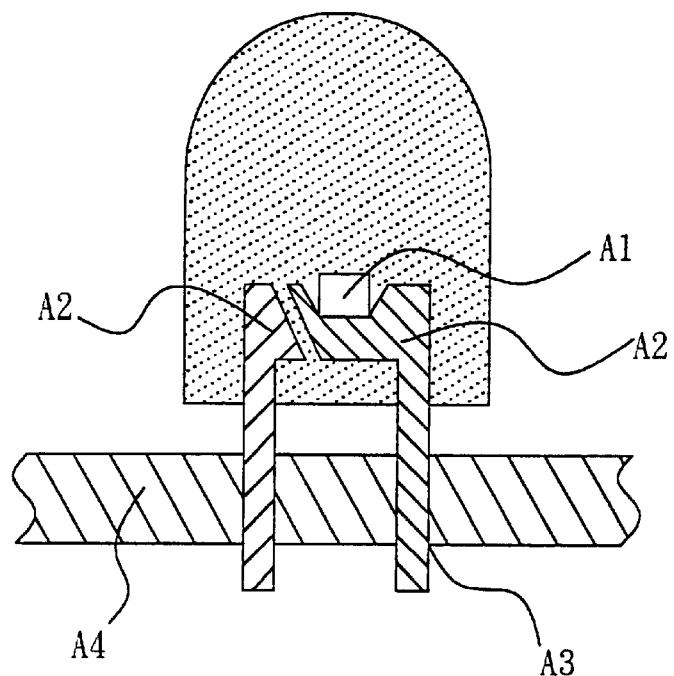
FIG. 1 is a sectional view of a conventional vertical-type light emitting diode.
Figure 2:
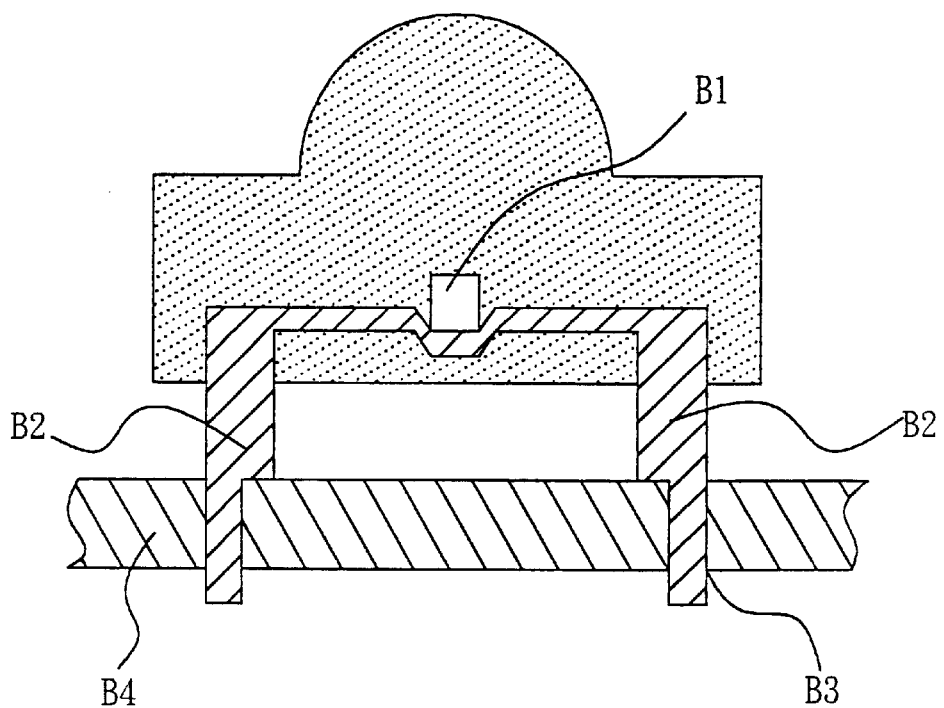
FIG. 2 is a sectional view of another conventional light emitting diode.
Figure 3:
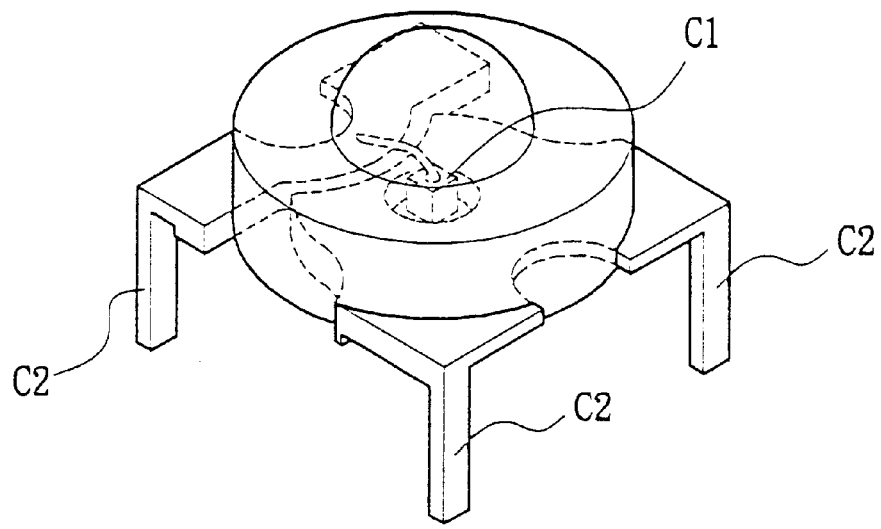
FIG. 3 is a perspective view of a light emitting diode according to a first embodiment of the present invention.
Figure 4:
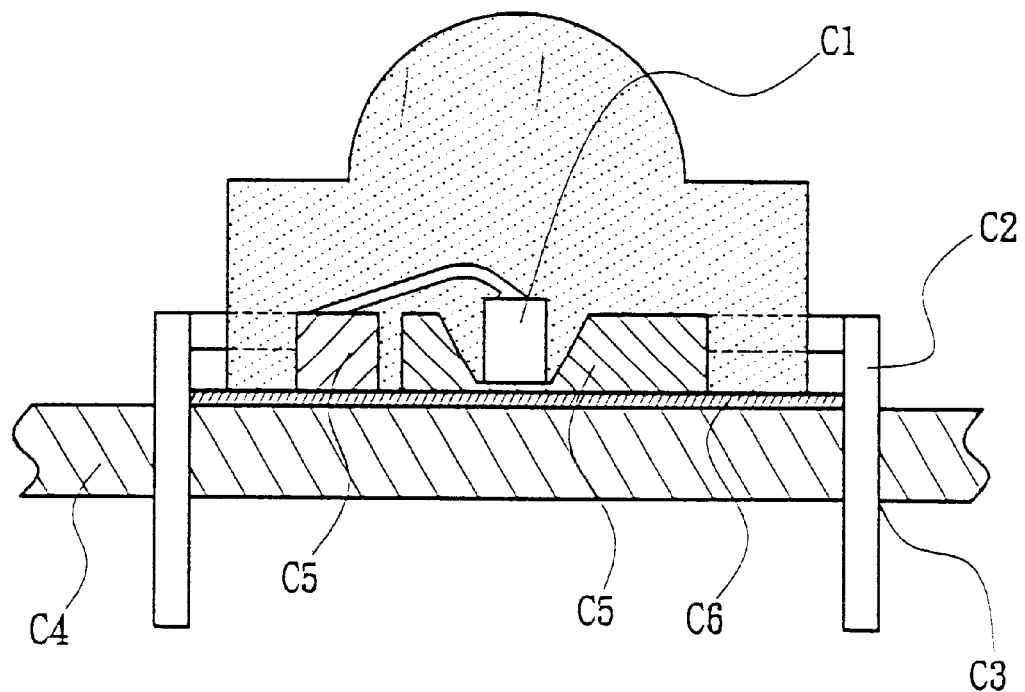
FIG. 4 is a sectional view of the light emitting diode of FIG. 3 being mounted on a printed circuit board.

Please refer to FIGS. 3 and 4 that are perspective and sectional views, respectively, of a light emitting diode according to a first embodiment of the present invention. As shown, the light emitting diode includes a chip C1 received in a bowl portion of a frame C2. The frame C2 has a thickness relatively larger than that of the frame B2 of the conventional light emitting diode shown in FIG. 2. Accordingly, it is possible for the bowl portion of the frame C2 to have a depth more than 0.6 mm that will largely upgrade a light-emitting efficiency of the light emitting diode. The frame C2 also has an increased width and leads downward extended from two outer sides of the frame C2. The increased thickness and width of the frame C2 enables the same to have increased radiating volume and enhanced radiation effect. Moreover, there are radiating blocks C5 and a layer of radiation-enhancing material C6 provided at a bottom of the frame C2. The frame C2 is soldered onto a printed circuit board C4 at soldering points C3, such that a large contact area exists between the frame C2 and the printed circuit board C4. Alternatively, the frame C2 may be connected to the printed circuit board C4 by means of screws instead of being soldered onto the printed circuit board C4 at soldering points C3. In this manner, the light emitting diode of the present invention may have relatively increased radiation efficiency and light-emitting efficiency in both theoretical basis and practical experimental basis. The light emitting diode of the present invention therefore has largely improved performance.

Figure 5:
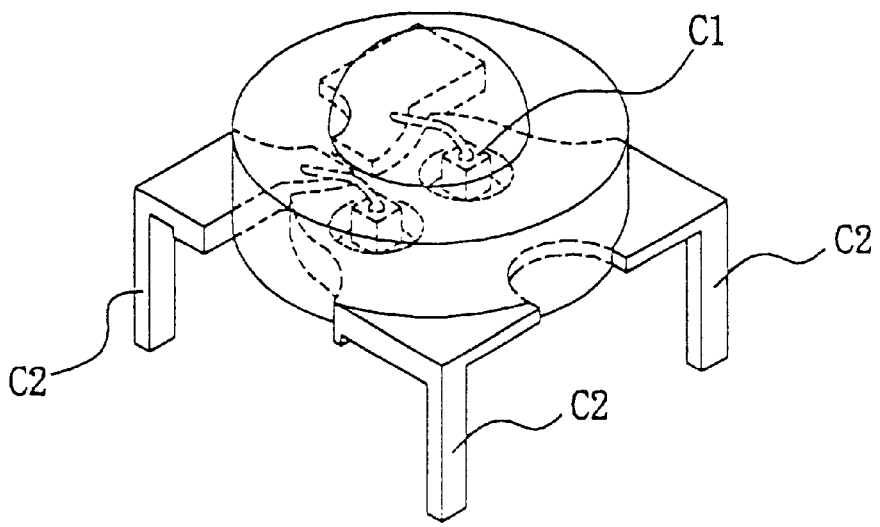
FIG. 5 is a perspective view of a light emitting diode according to a second embodiment of the present invention.
Figure 6:
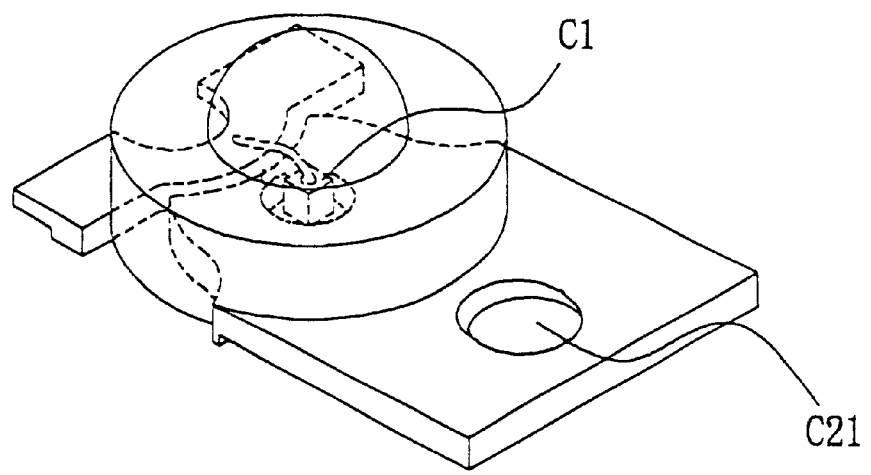
FIG. 6 is a perspective view of a light emitting diode according to a third embodiment of the present invention.

FIG. 5 shows a perspective view of another light emitting diode according to a second embodiment of the present invention. In the light emitting diode of this second embodiment, there are two bowl portions provided on the frame C2 for respectively receiving a chip C1 therein, so that the light emitting diode is able to emit two different color lights. When there are more than two bowl portions formed on the frame C2 for each receiving a chip C1, the light emitting diode is able to emit multiple different color lights.

In conclusion, the light emitting diode of the present invention has bowl portion or portions having an increased depth more than 0.6 mm, increased radiating volume, and increased contact area between the frame and the printed circuit board, and therefore has improved radiation efficiency and enhanced light-emitting efficiency.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A light emitting diode comprising:

at least one chip;

a frame having at least one bowl portion for receiving each of said at least one chip therein, wherein said bowl portion penetrates an upper portion of said frame to a depth of at least 0.6 mm;

a first set of leads and at least a second set of leads extending from said frame;

a first radiating block mounted on said frame and electrically coupled to said first set of leads; and at least a second radiating block mounted on said frame, wherein each of said second radiating blocks is electrically coupled to a respective one of said second set of leads, and wherein said second radiating blocks are displaced and electrically insulated from said first radiating block.

2. A light emitting diode as claimed in claim 1, further comprises a layer of radiation-enhancing material affixed to underside surfaces of said frame and said radiating blocks.

3. A light emitting diode as claimed in claim 1, wherein said frame and underside surfaces of said radiating blocks are placed in physical contact with a printed circuit board.

4. A light emitting diode as claimed in claim 2, wherein said layer of radiation-enhancing material is placed in direct contact with said printed circuit board.

* * * * *